United States Patent
Smith et al.

(10) Patent No.: US 6,181,204 B1
(45) Date of Patent: Jan. 30, 2001

(54) LINEAR AND MULTI-SINH TRANSCONDUCTANCE CIRCUITS

(75) Inventors: Douglas L. Smith; Robert J. Zakowicz, both of Tucson, AZ (US)

(73) Assignees: Maxim Integrated Products, Inc., Sunnyvale, CA (US); Gain Technology Corp., Tucson, AR (US)

(*) Notice: Under 35 U.S.C. 154(b), the term of this patent shall be extended for 0 days.

(21) Appl. No.: 09/439,583

(22) Filed: Nov. 12, 1999

Related U.S. Application Data

(62) Division of application No. 09/144,214, filed on Aug. 31, 1998.

(51) Int. Cl.[7] ............................ H03F 3/45; H03F 3/68; H03F 3/04
(52) U.S. Cl. ..................... 330/261; 330/295; 330/310
(58) Field of Search ........................... 330/252, 261, 330/295, 310

(56) References Cited

U.S. PATENT DOCUMENTS

| | | |
|---|---|---|
| 4,965,528 | 10/1990 | Okanobu . |
| 5,006,818 | 4/1991 | Koyama et al. . |
| 5,079,515 | 1/1992 | Tanimoto . |
| 5,166,635 * | 11/1992 | Shih ....................................... 330/295 |
| 5,557,238 * | 9/1996 | Weiss ..................................... 330/261 |
| 5,559,470 | 9/1996 | Laber et al. . |
| 5,903,185 | 5/1999 | Cargill . |
| 6,064,258 * | 5/2000 | Shulman ............................... 330/295 |

OTHER PUBLICATIONS

Katsuji Kimura, "The Ultra–Multi–Tanh Technique for Bipolar Linear Transconductance Amplifiers ", Apr. 1997, IEEE Transactions on Circuits and Systems–I Fundamental Theory and Applications, vol. 44, No. 4, pp. 288–302.

Barrie Gilbert, "Translinear Circuits," May 1981, ECESSO course notes, University of Arizona, Original Publication Unknown.

Douglas Lee Smith, "High Speed Operational Amplifier Architectures," 1993 IEEE, Bipolar Circuits and Technology Meeting 9.1.

* cited by examiner

*Primary Examiner*—Michael B Shingleton
(74) *Attorney, Agent, or Firm*—Hickman Coleman & Hughes, LLP

(57) ABSTRACT

The present invention teaches a variety of transconductance circuits formed having two or more class AB transconductor amplifiers coupled in parallel. The class AB transconductor amplifiers have non-linear voltage to current transfer functions and are each designed with an offset chosen such that the combination of the individual nonlinear transfer functions achieve a more linear transconductance circuit.

61 Claims, 15 Drawing Sheets

LINEAR AND MULTI-SINH TRANSCONDUCTANCE CIRCUITS

This application is a Division of Ser. No. 09/144,214 filed Aug. 31, 1998.

TECHNICAL FIELD

The present invention is related to operational amplifier design. More specifically, the present invention teaches a variety of linear and multi-sinh transconductance circuits each well suited for use as a low-distortion input stage in an operational amplifier.

BACKGROUND ART

In the design of operational amplifiers, it is important to provide a highly linear (i.e., low distortion), low noise amplifier capable of wide bandwidth operation. Bandwidth limitations, noise, and distortion can arise at any stage within the operational amplifier, but for present purposes the focus is upon the input stage. The typical input stage is a transconductor or transconductance circuit operable to convert an input voltage signal into an internal current signal more suitable for amplification by the output stage. Hence, the defining feature of the transconductance circuit is its voltage to current transfer function.

Prior Art FIG. 1 illustrates the prototypical input stage transconductor 10, i.e., a differential transistor pair. The transconductor 10 includes a pair of transistors Q1 and Q2 whose emitters are coupled to, a bias current source $I_{DC}$ that provides "tail" current for the transconductor 10. The differential voltage input pair $V_{IN+}$ and $V_{IN-}$ drive the bases of the transistors Q1 and Q2, essentially steering the resulting differential current pair $I_{OUT+}$ and $I_{OUT-}$ to a common ground reference 20. As will be appreciated, the voltage to current transfer function of the differential pair transconductor 10 is ideally a hyperbolic tangent (tanh) function.

While widely applicable and well suited for certain applications, the transconductor 10 suffers many shortcomings. When used within an amplifier having a capacitive feedback loop, as is often the case, the transconductor 10 is extremely limiting on the slew rate. (An amplifier's slew rate defines the maximum rate of change in voltage across the input and output terminals of the amplifier.) Specifically, the total current available to charge the feedback loop compensation capacitor $C_C$ is limited by the so-call "tail current" of the differential pair, i.e., the bias current $I_{DC}$.

For the present analysis, it is fair to assume that the slew rate is equal to $I_{DC}/C_C$. Hence to improve the slew rate, one must decrease $C_C$ and/or increase $I_{DC}$, both of which are undesirable for a variety of well known reasons. Additionally, the tanh transfer function of the differential pair transconductor 10 means that transconductor 10 is a non-linear, distortive circuit.

One common approach for addressing the slew rate limitations of the differential pair transconductor 10 of FIG. 1 is to use a class AB transconductance amplifier. Prior Art FIG. 2 illustrates one typical class AB amplifier 100 formed from a pair of differentially coupled diamond followers whose output emitters are coupled through a common load resistance $R_{DGEN}$. Each diamond follower includes a pair of bias current sources $I_{DC}$, and four transistors (one follower is made of transistors Q1–Q4, the other follower is made of transistors Q5–Q8).

The voltage to current transfer function of the class AB amplifier 100 without a common load resistance $R_{DGEN}$ (i.e., $R_{DGEN}$=0) is ideally a hyperbolic sine (sinh) function. Prior Art FIG. 4 illustrates such an ideal transconductance of the class AB amplifier 100 (i.e., dIout/dVout) as a function of input voltage. As seen in FIG. 4, the ideal transconductance of the class AB amplifier 100 is non-linear at voltages close to zero, but fairly linear elsewhere. The transfer function of the class AB amplifier will vary for different values of $R_{DGEN}$, but the non-linear characteristics are similar and related to the sinh function represented in FIG. 4.

In practice, the transconductance gain of the class AB amplifier 100 is set by the available bias current, the common load resistor $R_{DGEN}$, and the nonlinear transconductance characteristics of the individual transistors. However, when $R_{DGEN}$ is large it dominates the nonlinear effects of the individual transistors, thereby improving the distortion characteristics of the class AB amplifier 100. Unfortunately, increasing $R_{DGEN}$ increases noise in the class AB amplifier 100 due to thermal noise of the resistor.

As mentioned above with reference to the differential pair transconductor 10 of FIG. 1, much of the non-linearity of transconductor 10 is due to the tanh nature of its transfer function. One well-known technique for linearizing differential pair transconductors is the so-called "multi-tanh technique." As will be appreciated, the key to the multi-tanh technique is the placement of multiple nonlinear tanh transconductors (i.e., differential pairs) along the input-voltage axis to achieve in combination a more linear transfer function.

Prior Art FIG. 3 illustrates a multi-tanh doublet 200 formed from two differential pairs Q1–Q2 and Q3–Q4 and two bias current sources $I_{DC}$. Positive and negative offsets are introduced by forming each differential transistor pair with a gain imbalance. Specifically, a positive offset is introduced into the differential pair Q1–Q2 by forming transistor Q1 with a gain A that is greater than unity, and transistor Q2 with a gain of substantially unity. Likewise, a negative offset is introduced into the differential pair Q3–Q4 by forming transistor Q4 with a gain A that is greater than unity and transistor Q3 with a gain of substantially unity. Prior Art FIG. 5 illustrates the combined transconductance gain.

The multi-tanh transconductors do improve the distortion characteristics of an input stage, however the multi-tanh technique does not address the slew rate and other problems of the differential pair transconductor. Likewise, the class AB amplifier provides an improved slew rate, yet suffers from the nonlinearity about zero due to its sinh transfer function. What are needed are a variety of transconductance circuits that are highly linear with low noise, and having bandwidth characteristics not limited by slew rate.

DISCLOSURE OF THE INVENTION

The present invention teaches a variety of transconductance circuits such as transconductance circuits formed having a plurality of class AB transconductor amplifiers coupled in parallel. The class AB transconductor amplifiers have non-linear voltage to current transfer functions. Each class AB transconductor amplifier is designed with an offset chosen such that the individual nonlinear transfer functions are arranged along the input voltage axis to achieve a more linear transfer function for the combined transconductance circuit.

For example, a first embodiment of the present invention discloses a transconductance circuit characterized by a voltage to current transfer function, the transconductance circuit including a pair of class AB transconductance amplifiers coupled in parallel across differential input and output pairs. The first class AB transconductance amplifier has a positive offset. The second class AB transconductance amplifier has a negative offset. These negative and positive offsets are selected to improve linearity of the voltage to current transfer function of the transconductance circuit. It is contemplated that offsets may be of equal or differing magnitudes.

In certain embodiments, the class AB transconductance amplifiers are formed from a pair of differentially coupled diamond followers and a common load resistance $R_{DGEN}$. Each diamond follower has four transistors and two bias current sources. The transconductance of each class AB amplifier is thus a function of transistor gain, the available bias current and the common load resistance $R_{DGEN}$.

The present invention further teaches an operational amplifier having an input stage and a second stage (e.g., gain stage or output stage) coupled in series. The input stage, characterized by a voltage to current transfer function, includes a plurality of class AB transconductance amplifiers coupled in parallel. Each of the class AB transconductance amplifiers has an offset selected such that the combination tends to improve the linearity of the transfer function of the input stage.

Many embodiments of the present invention will involve coupling directly the outputs of parallel class AB transconductance amplifiers. However, such a step is not necessary to accomplish the improvements in linearity contemplated by the present invention. For example, the parallel class AB transconductance amplifiers often represent one stage in a circuit having multiple stages serial and/or parallel coupled. So, the output of a first class AB transconductance amplifier may drive one subsequent stage, while the output of a second class AB transconductance amplifier may drive another subsequent stage. These two subsequent stages are later combined (either directly or indirectly) thereby providing increased linearity at a subsequent stage (such as the output) of the multiple stage circuit.

As implied in the preceding paragraph, other circuitry may be coupled in parallel with the class AB transconductance amplifiers. This results in a transconductance stage providing the improved linearity of parallel coupled, properly offset class AB transconductance amplifiers, together with the electrical characteristics introduced by the additional parallel circuitry.

BRIEF DESCRIPTION OF THE DRAWINGS

Prior Art

Prior Art

Prior Art

Prior Art

Prior Art

BEST MODES FOR CARRYING OUT THE INVENTION

The present invention teaches a variety of transconductance circuits formed having two or more class AB transconductor amplifiers coupled in parallel. The class AB transconductor amplifiers have non-linear voltage to current transfer functions. Each class AB transconductor amplifier is designed with an offset chosen such that the individual nonlinear transfer functions are arranged along the input voltage axis to achieve a more linear transfer function of the combined transconductance circuit.

Figure 6:
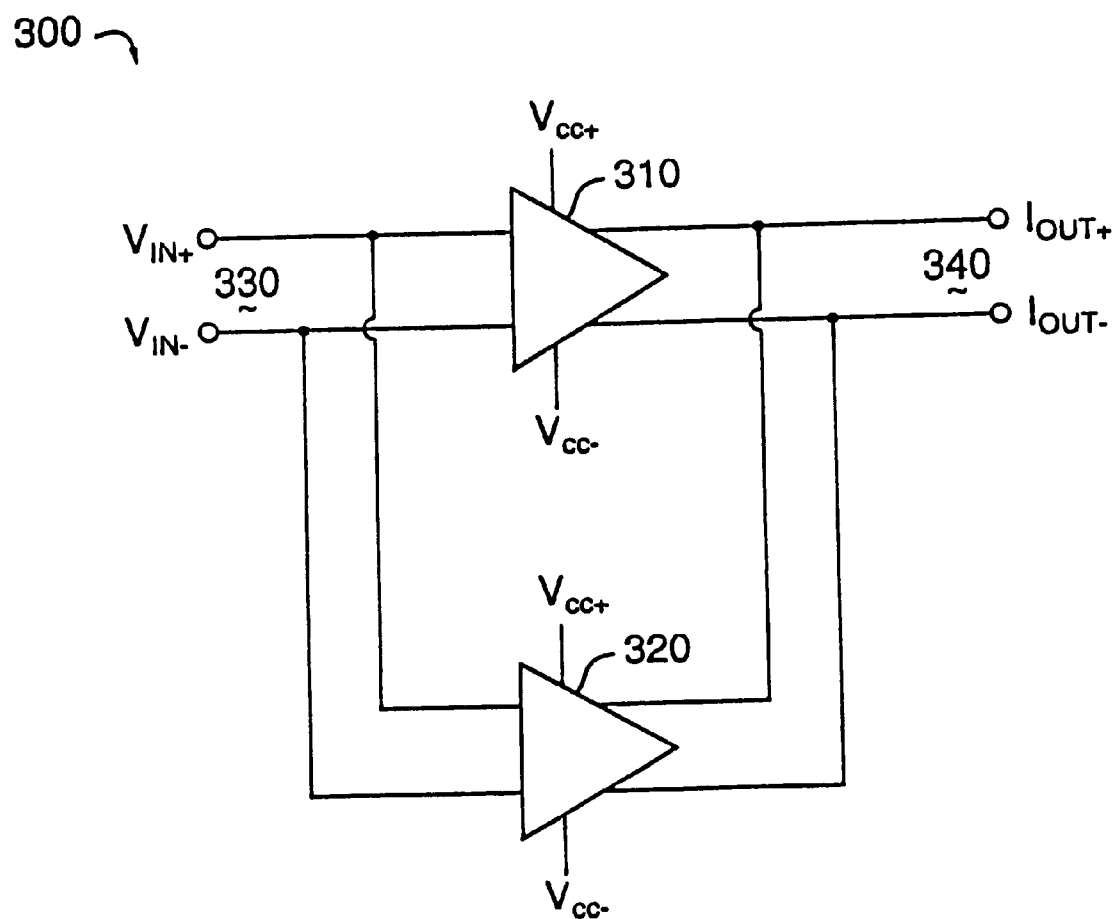
FIG. 6 is a schematic of a transconductance circuit in accordance with one embodiment of the present invention.

FIG. 6 illustrates a transconductance circuit 300 in accordance with a first embodiment of the present invention. The transconductance circuit 300 includes a pair of class AB amplifiers 310 and 320 coupled in parallel across differential input pair 330 and differential output pair 340. Each class AB amplifier 310 and 320 is designed with an offset providing a more linear transfer function from the transconductance circuit 300.

The teaching of the present invention improves linearity of the transconductance circuit 300 regardless of the type of class AB amplifier utilized. Accordingly, the class AB amplifier type may be selected from any of the wide variety of class AB amplifier designs. (Some specific class AB amplifiers are described below in more detail with reference to FIGS. 8 and 9a–9d.) Further, the pair of class AB amplifiers 310 and 320 may be of identical type or of differing type, demonstrating similar or dissimilar electrical characteristics. It is likely, however, that most applications will utilize two electrically similar class AB amplifiers such that the non-linearities are more easily cancelled. Those skilled in the art of electronics should be well familiar with the design and implementation of class AB amplifiers.

Figure 7A:
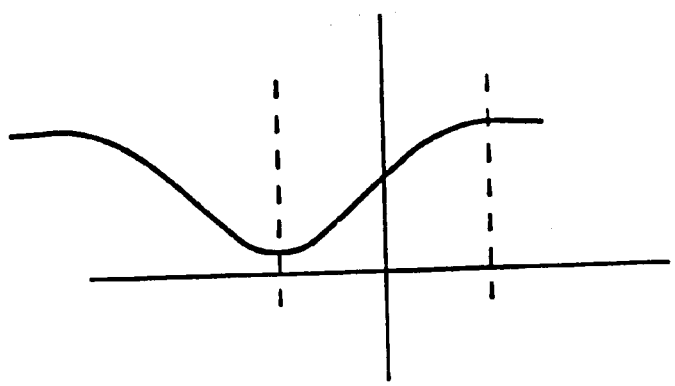
FIG. 7A is a graph representing transconductance gain of one class AB transconductor amplifier with positive offset.
Figure 7B:
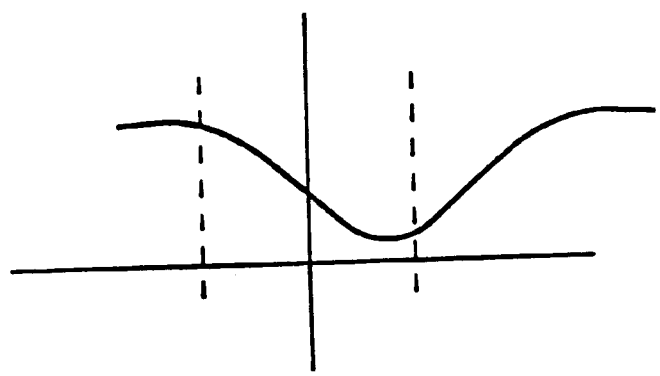
FIG. 7B is a graph representing transconductance gain of one class AB transconductor amplifier with negative offset.
Figure 7C:
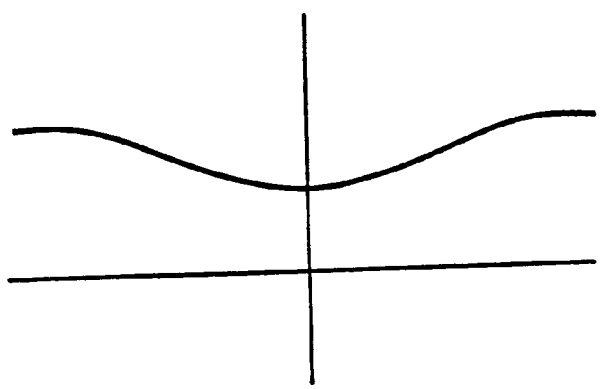
FIG. 7C is a graph representing transconductance gain of the multi-sinh transconductance circuit of FIG. 6.

As noted above, one important aspect underlying the present invention involves selecting the offsets of the individual class AB amplifiers in order to improve linearity of the transconductance circuit 300. In the embodiment of FIG. 6, the class AB amplifier 310 is formed having a positive voltage offset. A representation of the transconductance gain of the class AB amplifier 310 is shown in FIG. 7A. The class AB amplifier 320 is formed having a negative voltage offset and a representation of its transconductance gain is shown in FIG. 7B. The transconductance gain of the transconductance circuit 300 is essentially a combination of the non-linear gains of both amplifiers 310 and 320, and has a much more linear transconductance as shown in FIG. 7C. Please note that the gain representations of FIGS. 7A–7C are simply examples of possible non-linear gain functions provided by the class AB amplifiers. In application, the realized gain will be a function of the specific class AB amplifier utilized.

Figure 8:
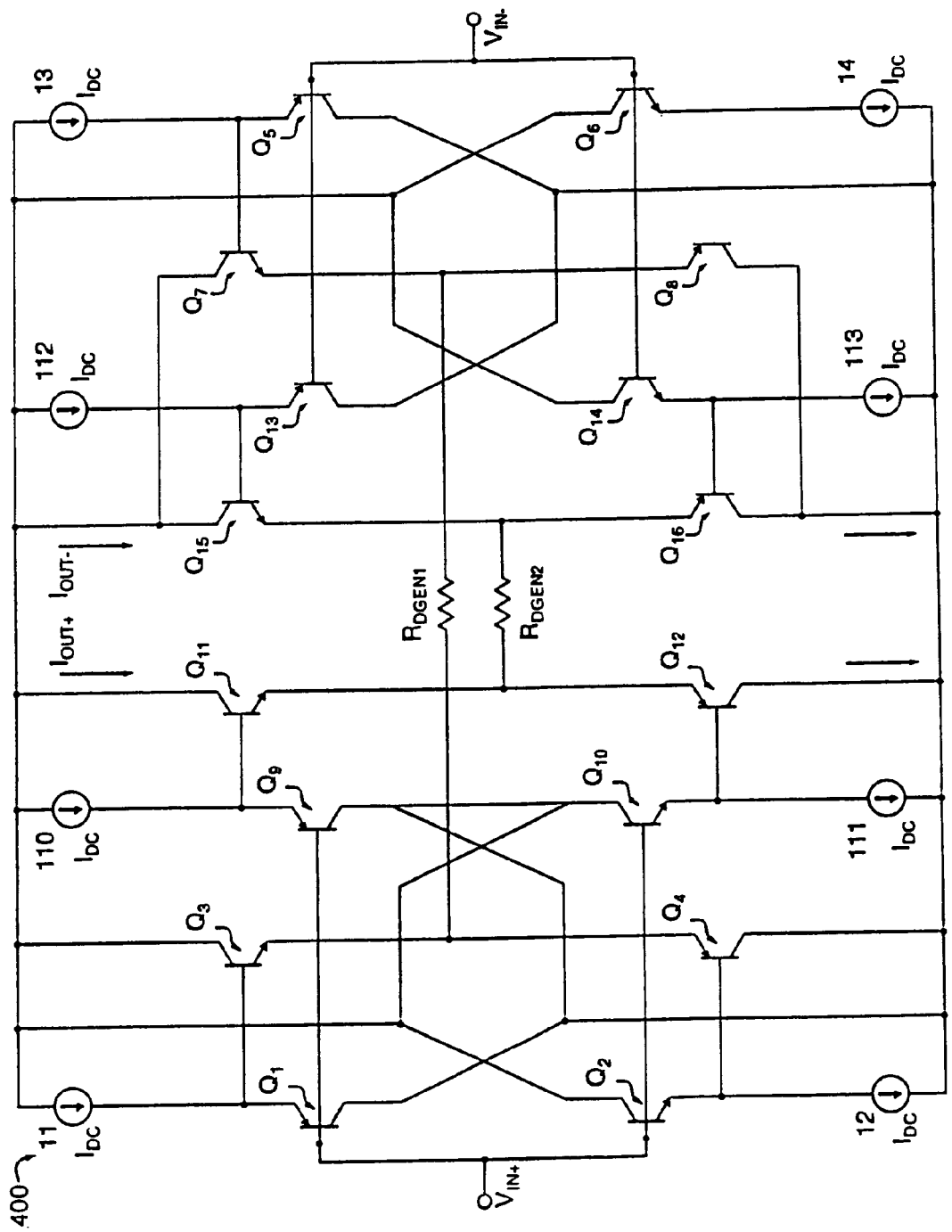
FIG. 8 is a schematic illustrating with particularity one embodiment of the transconductance circuit in accordance with one embodiment of the present invention.

FIG. 8 illustrates a transconductance circuit 400 in accordance with yet another embodiment of the present invention. Like FIG. 6, the transconductance circuit 400 includes two class AB transconductor amplifiers coupled in parallel. As described above with reference to FIG. 6, each of these class AB amplifiers is designed with an offset, the offsets selected such that the linearity of the transconductance circuit 400 is improved over the linearity of a single class AB transconductor amplifier. However, the transconductor circuit 400 shows how one particular type of class AB amplifier is coupled in accordance with the present invention.

The first class AB amplifier of FIG. 8 is formed from a pair of differentially coupled diamond followers whose output emitters may be coupled through a common load resistance $R_{DGEN1}$. Alternatively, the common load resistance $R_{DGEN1}$ can be left out of the circuit. Each diamond follower includes a pair of bias current sources $I_{DC}$, and four transistors (one follower is made of transistors Q1–Q4, the other follower is made of transistors Q5–Q8). The second class AB amplifier likewise is formed from a pair of differentially coupled diamond followers whose output emitters may be coupled through a common load resistance $R_{DGEN2}$. Again, the common load resistance $R_{DGEN2}$ can alternatively be left out. Each diamond follower includes a pair of bias current sources $I_{DC}$, and four transistors (one follower is made of transistors Q9–Q12, the other follower is made of transistors Q13–Q16). As will be appreciated, the gain of the class AB amplifiers of FIG. 8 implemented with bipolar transistors and lacking the common load resistance is ideally a hyperbolic sine (sinh) function.

Offset can be introduced into the class AB amplifiers of the transconductance circuit 400 through several different techniques. One preferred technique involves selecting the size or saturation current of the different transistors appropriately. For example, positive offset can be introduced into the first class AB amplifier by setting the sizes of transistors Q2 and Q5 to some value greater than unity, and setting the sizes of the other transistors of the first class AB amplifier to unity. Likewise, negative offset can be introduced into the second class AB amplifier by setting the sizes of transistors Q9 and Q14 to some value greater than unity, and setting the sizes of the other transistors of the second class AB amplifier to unity. Of course, those of skill in the art will recognize that a variety of different configurations of the transistor sizes can produce the desired offset.

Another preferred technique for introducing offset into the class AB amplifiers of the transconductance circuit 400 involves selecting the values of the bias current sources $I_{DC}$ to be imbalanced. For example, positive offset could be introduced into the first class AB amplifier by having the bias current sources coupled to the emitters of transistors Q2 and Q5 be smaller than the bias current sources coupled to the emitters of transistors Q1 and Q6. Yet another technique for introducing offset into the class AB amplifiers of the transconductance circuit 400 involves adding resistors, as needed, in series with the base or emitter of selected transistors.

The transconductance circuit 400 of FIG. 8 illustrated a transconductance circuit of the present invention that utilized two class AB amplifiers of identical design type. Four other possible class AB amplifiers (450, 460, 470, and 480, respectively) are illustrated in FIGS. 9A–9D, these being just some of the numerous class AB configurations that are suitable for the present invention.

Figure 9A:
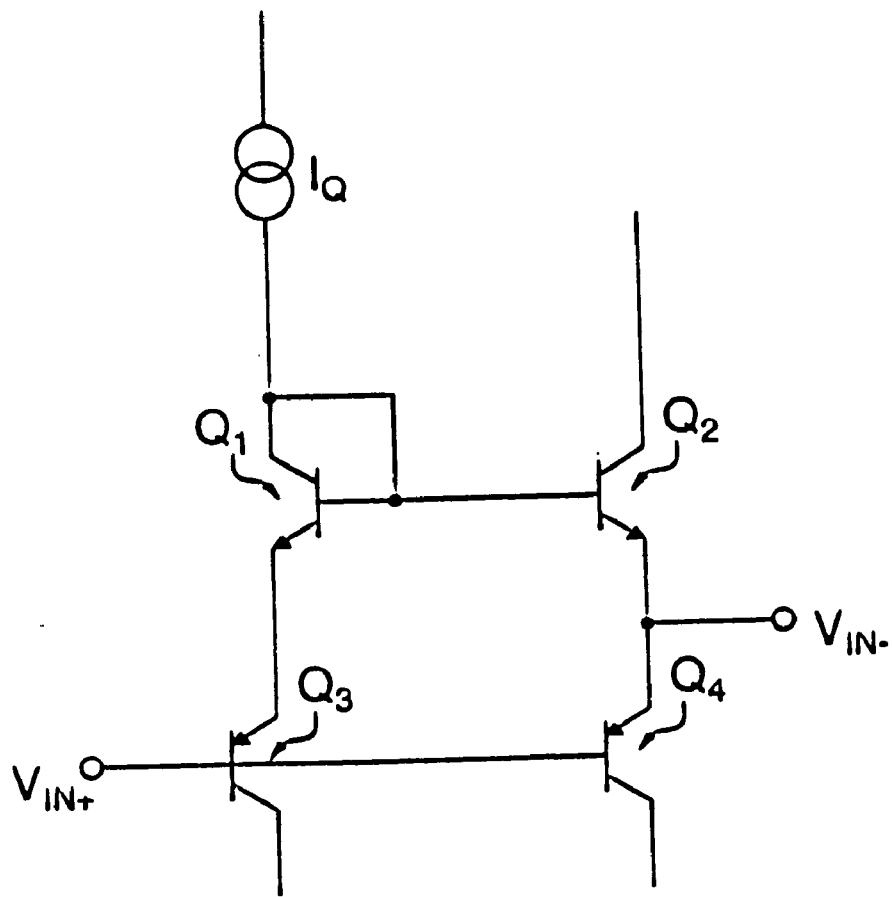
FIGS. 9A–9D provide schematic illustrations of several class AB amplifiers that are suitable for use in the present invention.

The class AB amplifier 450 of FIG. 9a is formed from a transistor quad (Q1–Q4) and a bias current source Iq. The input voltage $V_{IN+}$ is coupled to the bases of transistors Q3 and Q4. The input voltage $V_{IN-}$ is similarly coupled to the emitters of transistors Q2 and Q4. The emitters of transistors Q1 and Q3 are coupled together. The bias current Iq drives the collector of transistor Q1 and both bases of transistors Q1 and Q2.

Figure 9B:
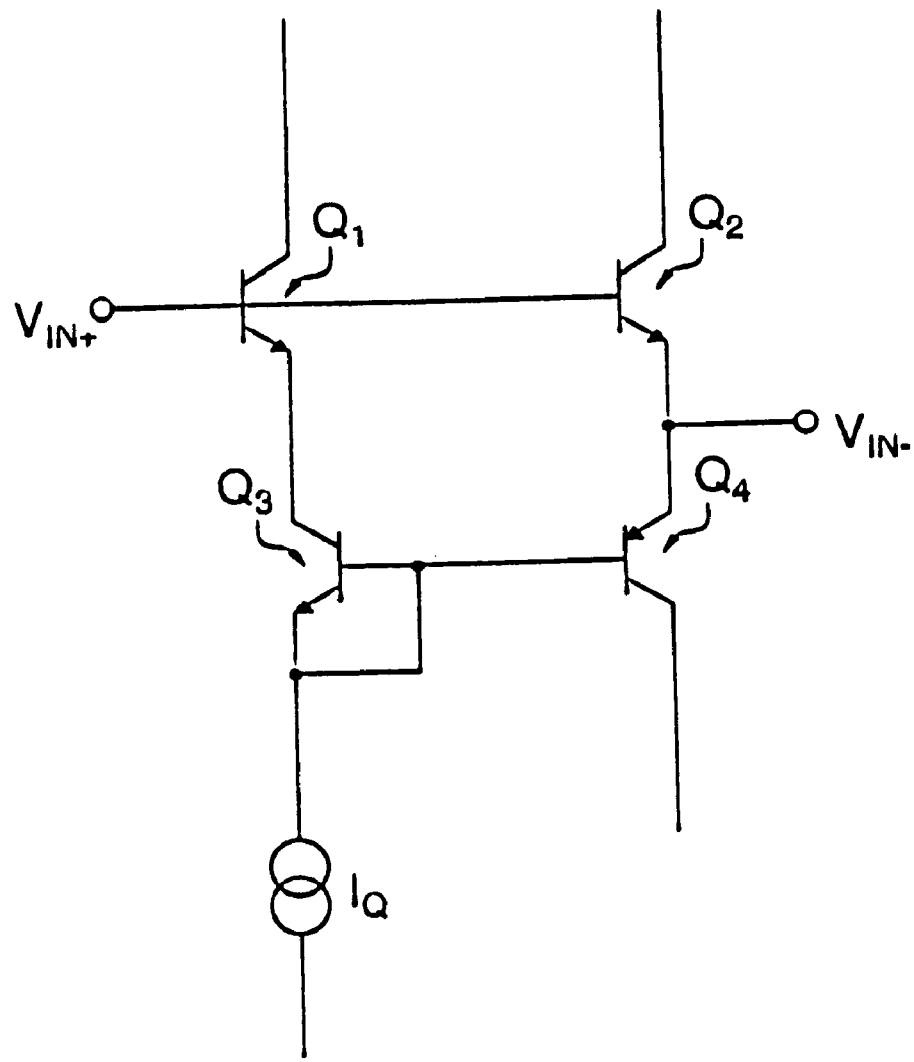

The class AB amplifier 460 of FIG. 9b is similarly formed from a transistor quad (Q1–Q4) and a bias current source Iq. The input voltage $V_{IN+}$ is coupled to the bases of transistors Q1 and Q2. The input voltage $V_{IN-}$ is similarly coupled to the emitters of transistors Q2 and Q4. The emitters of transistors Q1 and Q3 are coupled together. The bias current Iq drives the collector of transistor Q3 and both bases of transistors Q3 and Q4.

Figure 9C:
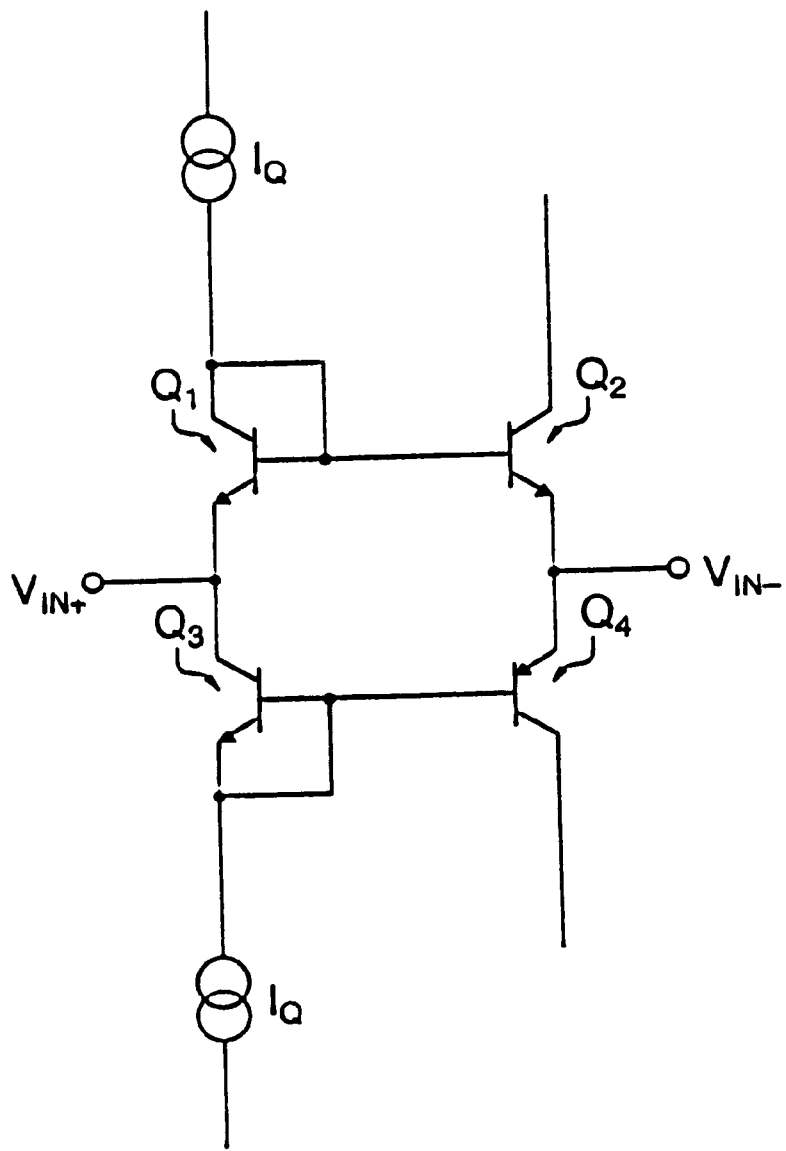

The class AB amplifier 470 of FIG. 9c is formed from a transistor quad (Q1–Q4) coupled with two bias current sources Iq. The input voltage $V_{IN+}$ is coupled to the emitters of transistors Q1 and Q3, while the input voltage $V_{IN-}$ is coupled to the emitters of transistors Q2 and Q4. The first bias current source Iq provides current to the collector of transistor Q1 and the bases of transistors Q1 and Q2. The second bias current source Iq provides current to the collector of transistor Q3 and the bases of transistors Q3 and Q4.

Figure 9D:
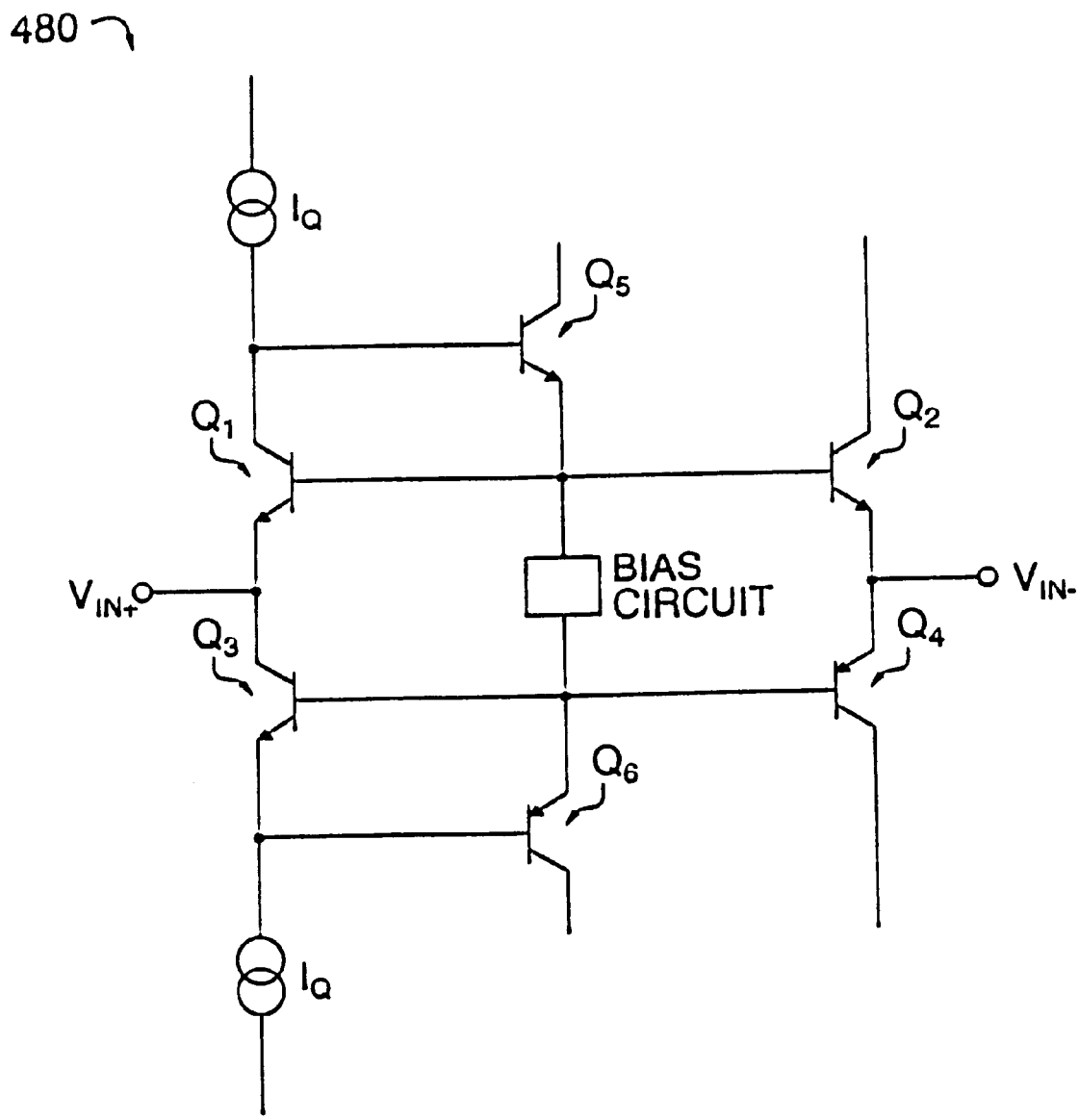

The class AB amplifier 480 of FIG. 9d is formed from six transistors (Q1–Q6), two bias current sources Iq, and a bias circuit. The input voltage $V_{IN+}$ couples to the emitters of transistors Q1 and Q3, while the input voltage $V_{IN-}$ couples to the emitters of transistors Q2 and Q4. The first bias current source Iq provides current to the collector of transistor Q1 and the base of transistors Q5. The second bias current source Iq provides current to the collector of transistor Q3 and the base of transistors Q6. The bias circuit works in conjunction with transistors Q5 and Q6 to provide bias current to the bases of transistors Q1–Q4.

Figure 10:
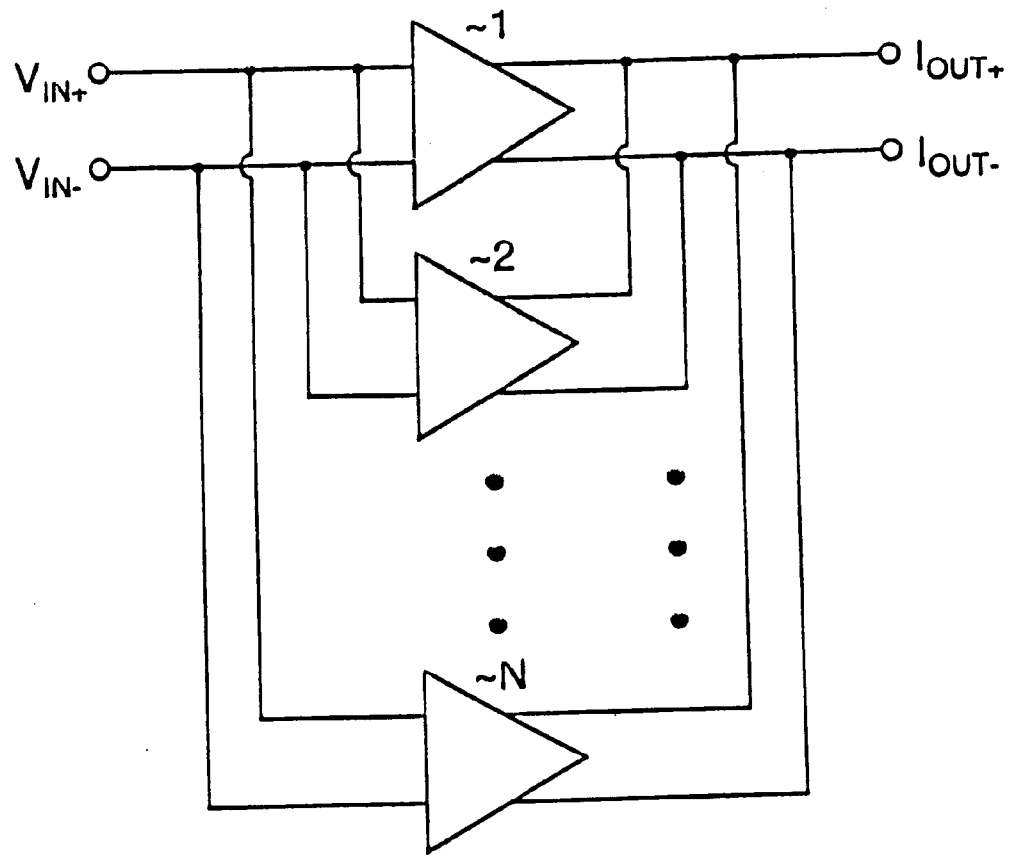
FIG. 10 is a schematic of a transconductance circuit having a plurality of class AB amplifier stages in accordance with still another embodiment of the present invention.

FIG. 10 illustrates a transconductance circuit 490 having a plurality N of class AB amplifiers coupled in parallel across input and output terminals. The linearity of a transconductance circuit 490 is further improved by providing a plurality of class AB transconductor amplifiers coupled in parallel. Each class AB transconductor amplifier 1 through N is designed with an offset chosen such that the individual nonlinear transfer functions are arranged along the input voltage axis to achieve a more linear transfer function of the combined transconductance circuit. These class AB transconductor amplifiers may have identical transfer functions, or may be selected according to the desired result.

Figure 11:
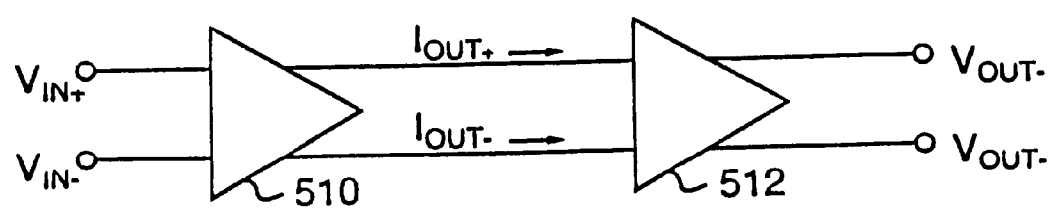
FIG. 11 is a schematic of an operational amplifier in accordance with yet another embodiment of the present invention.

FIG. 11 illustrates an operational amplifier 500 in accordance with still another embodiment of the present invention. FIG. 11 illustrates the operation amplifier 500 having two stages, i.e., input stage 510 and second stage 512. However, the operational amplifier 500 may have a plurality of stages depending upon the specific design. Importantly, however, the input stage 510 provides a linearized transconductor such as the transconductance circuit 400 of FIG. 8 and thus exhibits the improved linearity described above. The second stage 512 may be a gain stage or output stage operable to amplify the output current provided by the input stage 510, generating output voltage that is an amplified version of the input voltage provided at the input stage 512.

In the embodiments described above, the parallel class AB amplifiers were coupled directly together at their outputs. This essentially resulted in summing those outputs thereby improving linearity directly at the output of the transconductor stage. However, it is also contemplated that the outputs of parallel class AB amplifiers may be coupled to separate stages. By driving individual stages that are later combined, the linearity of the total circuit is improved—even though the outputs of the transconductance stage may not appear more linear.

Figure 12:
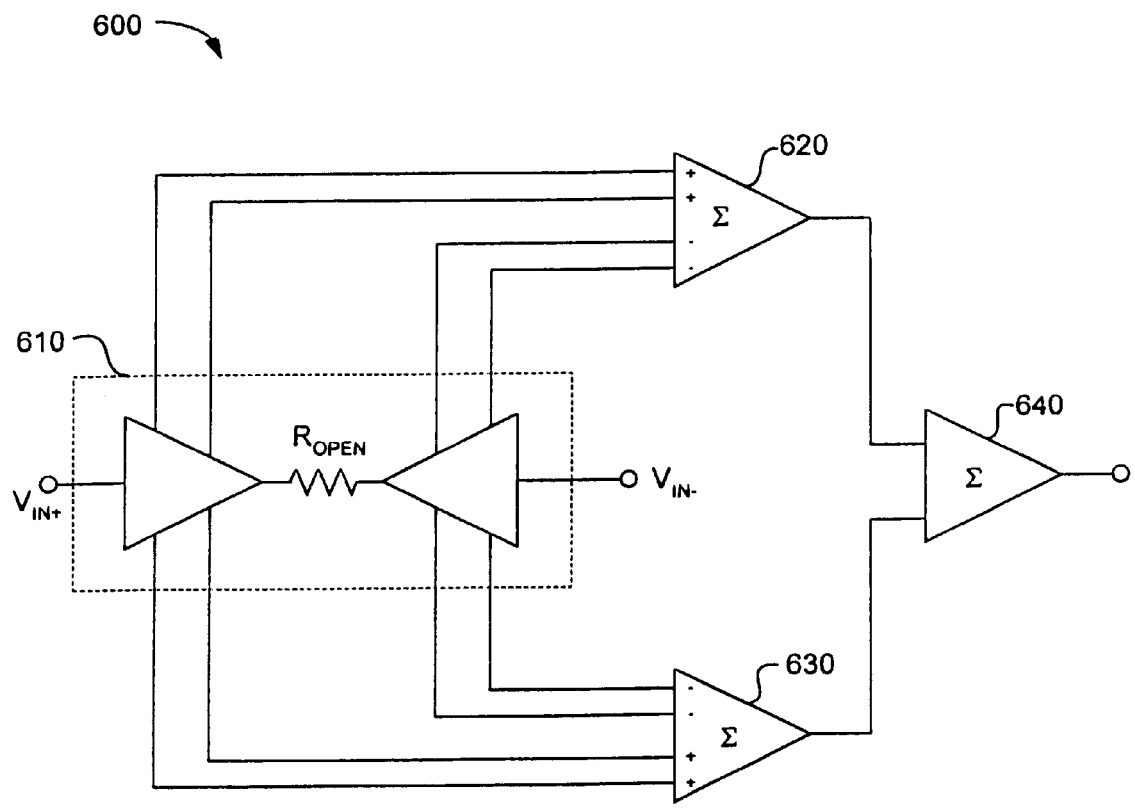
FIG. 12 is a schematic of a multiple stage circuit in accordance with a further embodiment of the present invention.

Turning to FIG. 12, a summing circuit 600 provides one example of such a multiple stage circuit. In FIG. 12, the summing circuit 600 includes a transconductance circuit 610 with class AB transconductance amplifiers parallel coupled and driving separate subsequent stages of the summing circuit. In this instance, the transconductance circuit 610 drives a pair of arithmetic circuits 620 and 630, which in turn drive a final summer circuit 640. Of course the summing circuit 600 of FIG. 12 is simply an example illustrating the decoupling of the outputs of the class AB transconductance amplifiers.

Figure 1:
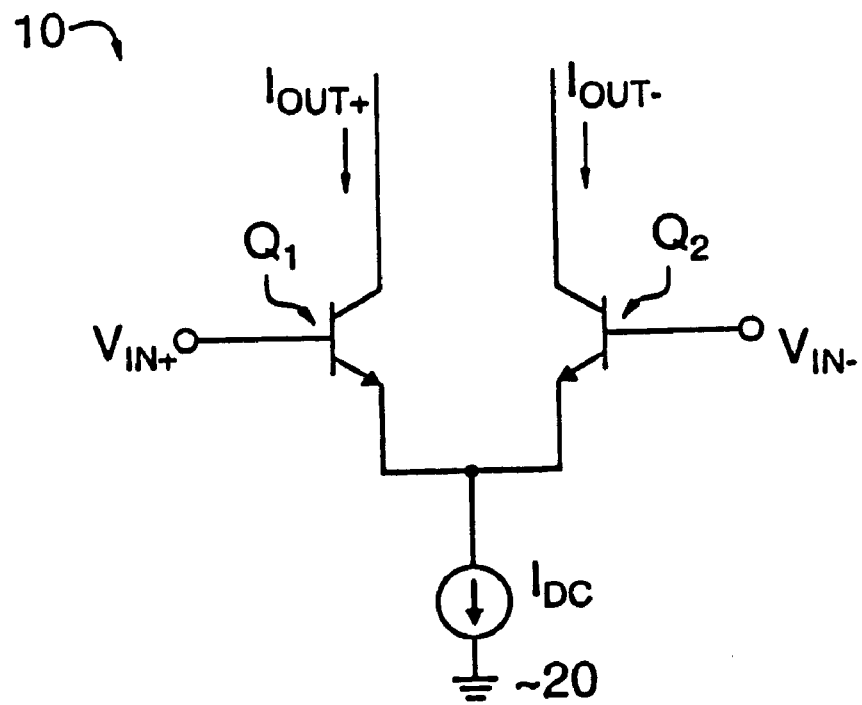
FIG. 1 is a schematic of a traditional differential transconductor that is simply a differentially connected pair of transistors.
Figure 2:
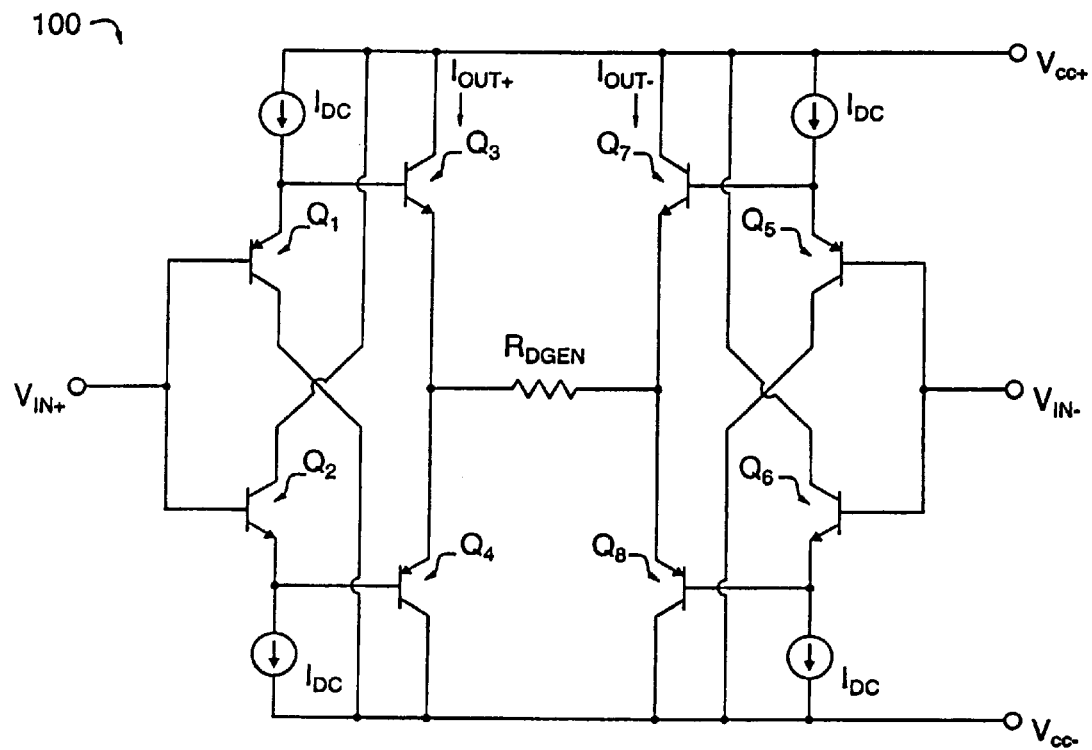
FIG. 2 is a schematic of a class AB input stage transconductor.
Figure 3:
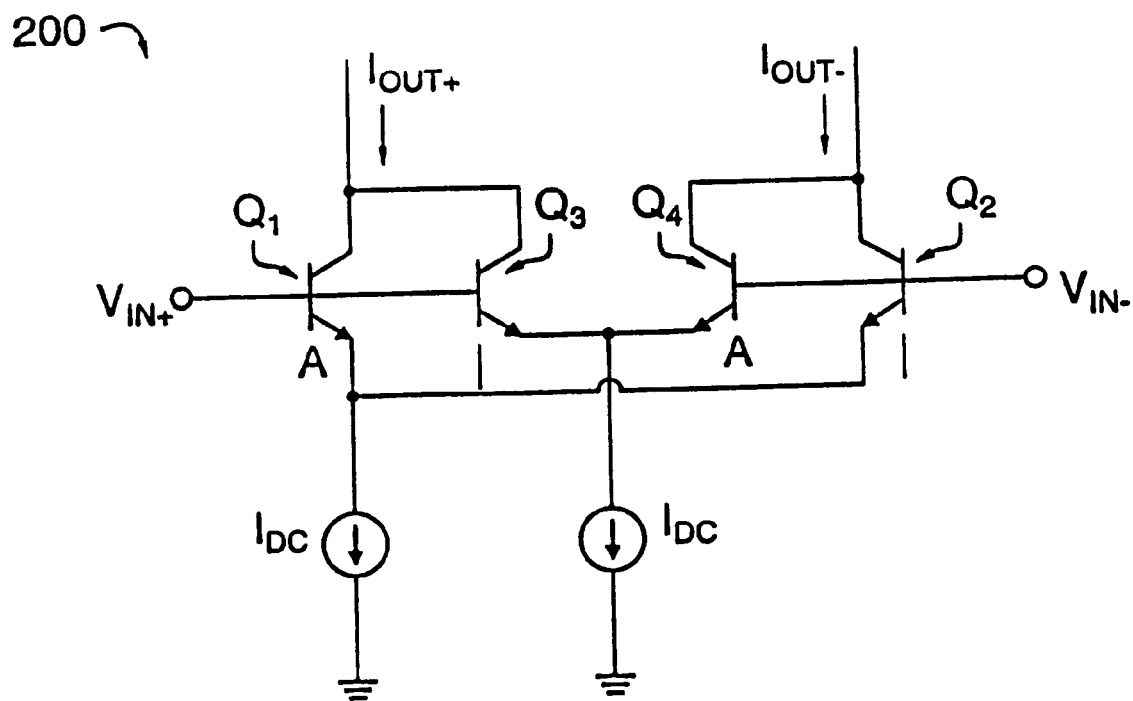
FIG. 3 is a schematic of a multi-tanh doublet input stage transconductor.
Figure 4:
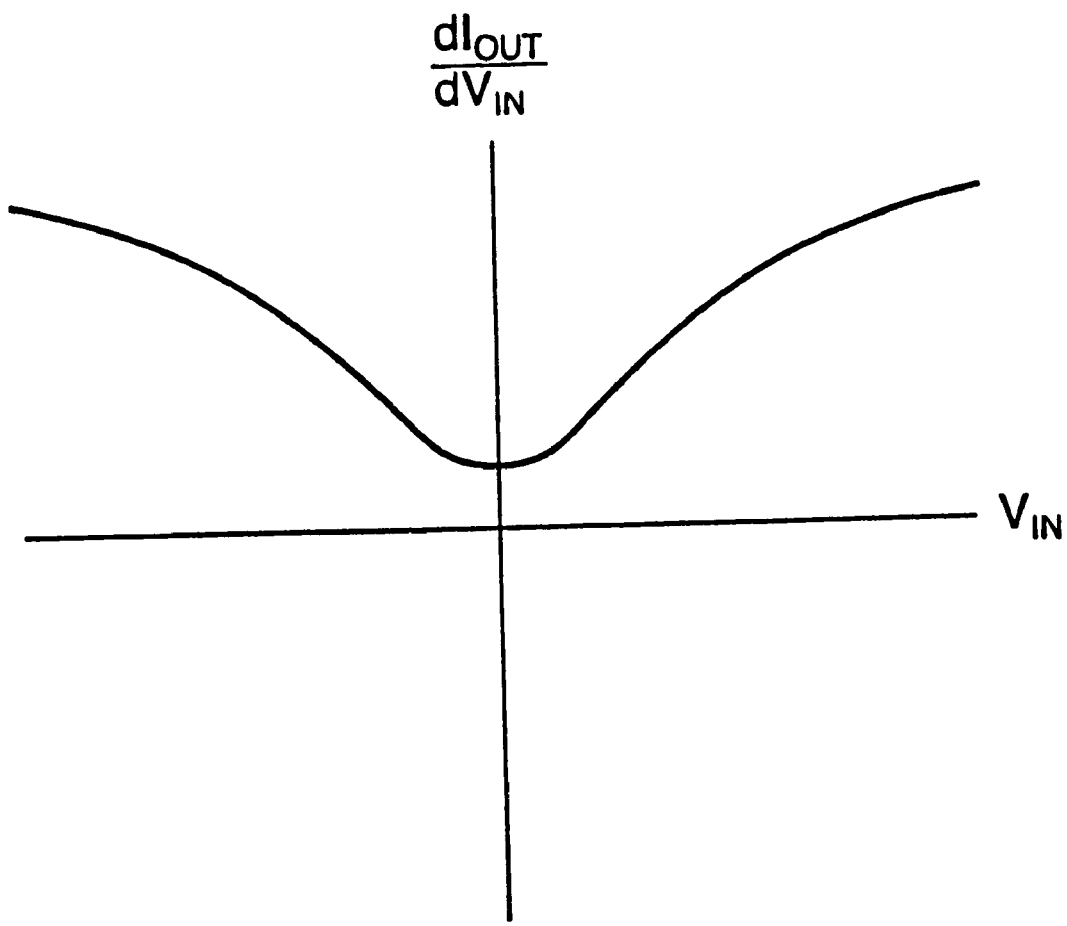
FIG. 4 is a graph representing transconductance gain of the class A-B input stage transconductor as a function of input voltage.
Figure 5:
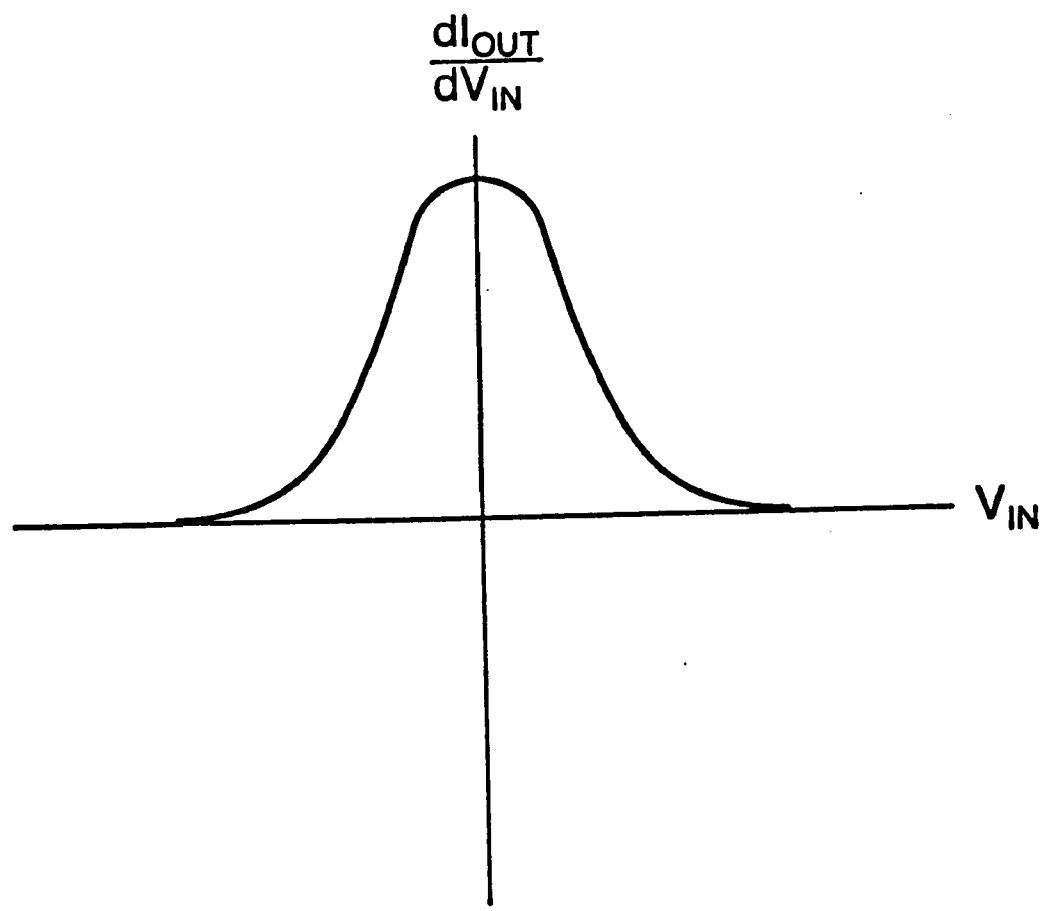
FIG. 5 is a second graph representing transconductance gain of the multi-tanh doublet input stage transconductor as a function of input voltage.

Further embodiments of the present invention related to FIG. 12 provide multiple stage circuits having a transconductance circuit formed with parallel coupled amplifiers other than class AB amplifiers. E.g., the transconductance circuit 312 may be formed using tanh type transconductors such as those described above with reference to FIG. 3, but with outputs decoupled. These parallel coupled amplifiers are connected at the input, have outputs driving separate subsequent stages, and have offsets selected to improve the linearity of the overall multiple stage circuit.

According to another aspect of the present invention, the transconductance circuitry may include devices other than class AB amplifiers. Other circuitry may be coupled in parallel and/or in series with the parallel coupled class AB amplifiers in order to achieve desired electrical characteristics of the transconductance circuitry. For example, a tanh doublet such as that described above with reference to FIG. 3 may be coupled in parallel with the class AB amplifiers.

Although only a few embodiments of the present invention have been described in detail herein, it should be understood that the present invention may be embodied in many other specific forms without departing from the spirit or scope of the invention.

For example, the symbol utilized to denote transistors in the Figures is generally known to represent bipolar type transistor technology. However, it will be appreciated that field-effect transistors (FETs) such as MOSFETs would work well for the present invention.

The present invention is in no way limited to the particular class AB amplifiers described herein. Instead, as earlier mentioned, it is contemplated that any combination of any type of class AB amplifiers would be suitable.

Therefore, the present examples and embodiments are to be considered as illustrative and not restrictive, and the invention is not to be limited to the details given herein, but may be modified within the scope of the appended claims.

What is claimed is:

1. A transconductance circuit characterized by a voltage to current transfer function, the transconductance circuit comprising first and second class AB transconductance amplifiers coupled in parallel across differential input and output pairs, the first class AB transconductance amplifier having a positive offset and the second class AB transconductance amplifier having a negative offset, wherein the negative and positive offsets are selected to improve linearity of the voltage to current transfer function of the transconductance circuit.

2. A transconductance circuit as recited in claim 1, wherein a voltage to current transfer function of the first class AB transconductance amplifier is substantially a hyperbolic sine (sinh) function, and a voltage to current transfer function of the second class AB transconductance amplifier is substantially a sinh function.

3. A transconductance circuit as recited in claim 1 wherein the negative offset and the positive offset are of substantially identical magnitude.

4. A transconductance circuit as recited in claim 1 wherein the first class AB amplifier includes a pair of differentially coupled diamond followers and a common load resistance $R_{DGEN}$, each diamond follower having four transistors and two bias current sources, the transconductance of the first class AB amplifier being a function of transistor gain, the available bias current and the common load resistance $R_{DGEN}$.

5. A transconductance circuit as recited in claim 4 wherein the positive offset is due to an imbalance between the sizes of the transistors of the first class AB transconductance amplifier.

6. A transconductance circuit as recited in claim 4 wherein the positive offset is due to an imbalance between the bias current sources of the first class AB transconductance amplifier.

7. A transconductance circuit as recited in claim 4 wherein the positive offset is due both in part to an imbalance between the sizes of the transistors of the first class AB transconductance amplifier in part to an imbalance between the bias current sources of the first class AB transconductance amplifier.

8. A transconductance circuit as recited in claim 4 wherein the positive offset is due to the coupling of at least one resistor in series with an emitter or a base of a transistor located along the signal path.

9. A transconductance circuit as recited in claim 8 wherein the at least one resistor is a component of the first class AB transconductance amplifier.

10. A transconductance circuit as recited in claim 4 wherein the negative offset and the positive offset are of substantially identical magnitude.

11. A transconductance circuit as recited in claim 4 wherein the negative offset and the positive offset are of different magnitude.

12. A transconductance circuit as recited in claim 4 wherein the transistors are bipolar transistors.

13. A transconductance circuit as recited in claim 4 wherein the transistors are field-effect transistors.

14. A transconductance circuit as recited in claim 1 further including third and fourth class AB transconductance amplifiers connected in parallel with the first and second class AB transconductance amplifiers.

15. A transconductance circuit as recited in claim 1 wherein the transconductance circuit is formed on a single integrated circuit.

16. A transconductance circuit as recited in claim 1 wherein the first and second class AB transconductance amplifiers are of identical type.

17. A transconductance circuit as recited in claim 1 further including at least one additional class AB transconductance amplifier coupled in parallel across differential input and output pairs, the at least one additional class AB transconductance amplifier having an offset selected to improve linearity of the voltage to current transfer function of the transconductance circuit.

18. A transconductance circuit as recited in claim 17 wherein the offset of the at least one additional class AB transconductance amplifier is a zero offset.

19. A transconductance circuit as recited in claim 1 wherein the first class AB amplifier includes four transistors Q1–Q4 and a current source Iq, the current source Iq providing bias current to the collector of transistor Q1 and the bases of transistors Q1 and Q2, the emitters of transistors Q1 and Q3 coupled, the emitters of transistors Q2 and Q4 coupled, and the bases of Q3 and Q4 coupled.

20. A transconductance circuit as recited in claim 1 wherein the first class AB amplifier includes four transistors Q1–Q4 and a current source Iq, the current source Iq providing bias current to the collector of transistor Q3 and the bases of transistors Q3 and Q4, the emitters of transistors Q1 and Q3 coupled, the emitters of Q2 and Q4 coupled, and the bases of Q1 and Q2 coupled.

21. A transconductance circuit as recited in claim 1 wherein the first class AB amplifier includes four transistors Q1–Q4 and first and second current sources Iq, the first current source providing bias current to the collector of transistor Q1 and the bases of transistors Q1 and Q2, the second current source Iq providing bias current to the collector of transistor Q3 and the bases of transistors Q3 and Q4, the emitters of transistors Q1 and Q3 coupled, and the emitters of Q2 and Q4 coupled.

22. A transconductance circuit as recited in claim 1 wherein the first class AB amplifier includes six transistors Q1–Q6, first and second current sources, and a bias circuit, wherein the first current source provides bias current to the base of transistor Q5 and the collector of transistor Q1, the second current source provides bias current to the base of transistor Q6 and the collector of transistor Q3, bias current is provided to the bases of transistors Q1–Q4 via transistors Q5 and Q6 and the bias circuit, the emitters of Q1 and Q3 are coupled, and the emitters of Q2 and Q4 are coupled.

23. A transconductance circuit characterized by a voltage to current transfer function, the transconductance circuit comprising:
   a differential input pair;
   a differential output pair;
   a first class AB transconductance amplifier including a pair of differentially coupled diamond followers, each diamond follower having four transistors and two bias current sources, the transconductance of the first class AB amplifier being a function of transistor size and the available bias current, the first class AB transconductance amplifier having a positive offset; and
   a second class AB transconductance amplifier including a pair of differentially coupled diamond followers, each diamond follower having four transistors and two bias current sources, the transconductance of the second class AB amplifier being a function of transistor size and the available bias current, the second class AB transconductance amplifier having a negative offset,
   wherein the first and second class AB transconductance amplifiers are coupled in parallel across the differential input and output pairs, and the negative and positive offsets are selected to improve linearity of the voltage to current transfer function of the transconductance circuit.

24. A transconductance circuit as recited in claim 23, wherein a voltage to current transfer function of the first class AB transconductance amplifier is substantially a hyperbolic sin (sinh) function, and a voltage to current transfer function of the second class AB transconductance amplifier is substantially a sinh function.

25. A transconductance circuit as recited in claim 23 wherein the negative offset and the positive offset are of substantially identical magnitude.

26. A transconductance circuit as recited in claim 23 wherein the positive offset is due to an imbalance between the sizes of the transistors of the first class AB transconductance amplifier.

27. A transconductance circuit as recited in claim 26 wherein the negative offset is due to an imbalance between the sizes of the transistors of the second class AB transconductance amplifier.

28. A transconductance circuit as recited in claim 23 wherein the positive offset is due to an imbalance between the bias current sources of the first class AB transconductance amplifier.

29. A transconductance circuit as recited in claim 28 wherein the negative offset is due to an imbalance between the bias current sources of the second class AB transconductance amplifier.

30. A transconductance circuit as recited in claim 23 wherein the positive offset is due both in part to an imbalance between the gains of the transistors of the first class AB transconductance amplifier in part to an imbalance between the bias current sources of the first class AB transconductance amplifier.

31. A transconductance circuit as recited in claim 23 further including additional circuitry coupled in parallel with the first and second class AB transconductance amplifiers, the additional circuitry suitable for providing the transconductance circuit electrical characteristics not provided by the first and second class AB transconductance amplifiers.

32. A transconductance circuit as recited in claim 23 wherein the negative offset and the positive offset are of different magnitude.

33. A transconductance circuit as recited in claim 23 wherein the transistors are bipolar transistors.

34. A transconductance circuit as recited in claim 23 wherein the transistors are field-effect transistors.

35. A transconductance circuit as recited in claim 23, wherein the first class AB transconductance amplifier further includes a first common load resistance $R_{DGEN}$ and the second class AB transconductance amplifier further includes a second common load resistance $R_{DGEN}$.

36. A transconductance circuit as recited in claim 23 wherein the positive offset is due to the coupling of at least one resistor in series with an emitter or a base of a transistor located along the signal path.

37. A transconductance circuit as recited in claim 36 wherein the at least one resistor is a component of the first class AB transconductance amplifier.

38. An operational amplifier comprising:
   an input stage characterized by a voltage to current transfer function, the input stage including a plurality of class AB transconductance amplifiers coupled in parallel, each of the plurality of class AB transconductance amplifiers having an offset, the offsets of the plurality of class AB transconductance amplifiers selected to improve the linearity of the voltage to current transfer function of the input stage; and
   a second stage coupled in series with the input stage.

39. An operational amplifier as recited in claim 38, wherein a first of the plurality of class AB transconductance amplifiers includes a pair of differentially coupled diamond followers and a first common load resistance $R_{DGEN}$, each diamond follower having four transistors and two bias current sources, the transconductance of the first class AB amplifier being a function of transistor gain, available bias current and the first common load resistance $R_{DGEN}$.

40. An operational amplifier as recited in claim 39 wherein a voltage to current transfer function of the first class AB transconductance amplifier is substantially a hyperbolic sin (sinh) function, and a voltage to current transfer function of the second class AB transconductance amplifier is substantially a sinh function.

41. An operational amplifier as recited in claim 39 wherein the offset of the first class AB transconductance amplifier is due to an imbalance between the sizes of the transistors of the first class AB transconductance amplifier.

42. An operational amplifier as recited in claim 39 wherein the offset of the first class AB transconductance amplifier is due to an imbalance between the bias current sources of the first class AB transconductance amplifier.

43. A transconductance circuit as recited in claim 42 wherein the positive offset is due to the coupling of at least one resistor in series with an emitter or a base of a transistor located along the signal path.

44. A transconductance circuit as recited in claim 43 wherein the at least one resistor is a component of the first class AB transconductance amplifier.

45. An operational amplifier as recited in claim 39 wherein the transistors are bipolar transistors.

46. An operational amplifier as recited in claim 39 wherein the transistors are field-effect transistors.

47. An operational amplifier as recited in claim 38 wherein the operational amplifier is formed in a dual in-line integrated circuit package.

48. An operational amplifier as recited in claim 38 wherein the second stage is an output stage.

49. An operational amplifier as recited in claim 38 wherein the second stage is a gain stage.

50. An operational amplifier as recited in claim 38 wherein the second stage is one of a plurality of stages subsequent to the input stage.

51. A multiple stage circuit comprising:
a transconductance stage suitable for converting a voltage signal into a current signal, the transconductance stage having at least two parallel coupled transconductance amplifiers, inputs of the at least two parallel coupled transconductance amplifiers being directly coupled, wherein outputs of the at least two parallel coupled transconductance amplifiers are not directly coupled; and
a plurality of stages subsequent to the transconductance stage, the plurality of stages subsequent to the transconductance stage including:
a second stage responsive to a current signal, wherein an input of the second stage is coupled to an output of a first of the at least two parallel coupled transconductance amplifiers; and
a third stage responsive to a current signal, wherein an input of the third stage is coupled to an output of a second of the at least two parallel coupled transconductance amplifiers.

52. A multiple stage circuit as recited in claim 51 wherein the first transconductance amplifier has a positive offset and the second transconductance amplifier has a negative offset, the negative and positive offsets being selected to improve linearity of the multiple stage circuit.

53. A multiple stage circuit as recited in claim 51 wherein the first transconductance amplifier is a first class AB amplifier having a positive offset and the second transconductor amplifier is a second class AB amplifier having a negative offset, the negative and positive offsets being selected to improve linearity of the multiple stage circuit.

54. A multiple stage circuit as recited in claim 53 wherein the negative offset and the positive offset are of substantially identical magnitude.

55. A multiple stage circuit as recited in claim 53 wherein the first class AB amplifier includes a pair of differentially coupled diamond followers and a common load resistance $R_{DGEN}$, each diamond follower having four transistors and two bias current sources, the transconductance of the first class AB amplifier being a function of transistor gain, the available bias current and the common load resistance $R_{DGEN}$.

56. A multiple stage circuit as recited in claim 55 wherein the positive offset is due to an imbalance between the sizes of the transistors of the first class AB transconductance amplifier.

57. A multiple stage circuit as recited in claim 55 wherein the positive offset is due to an imbalance between the bias current sources of the first class AB transconductance amplifier.

58. A multiple stage circuit as recited in claim 55 wherein the positive offset is due both in pad to an imbalance between the sizes of the transistors of the first class AB transconductance amplifier in part to an imbalance between the bias current sources of the first class AB transconductance amplifier.

59. A multiple stage circuit ass recited in claim 55 wherein the positive offset is due to the coupling of at least one resistor in series with an emitter or a base of a transistor located along the signal path.

60. A multiple stage circuit as recited in claim 59 wherein the at least one resistor is a component of the first class AB transconductance amplifier.

61. A multiple stage circuit as recited in claim 55 wherein the transconductance circuit further includes third and fourth parallel coupled class AB transconductance amplifiers also coupled in parallel with the first and second class AB transconductance amplifiers.

* * * * *